US009077321B2

(12) United States Patent
Rozenbaum (10) Patent No.: US 9,077,321 B2
(45) Date of Patent: Jul. 7, 2015

(54) VARIABLE AMPLITUDE SIGNAL GENERATORS FOR GENERATING A SINUSOIDAL SIGNAL HAVING LIMITED DIRECT CURRENT (DC) OFFSET VARIATION, AND RELATED DEVICES, SYSTEMS, AND METHODS

(71) Applicant: Corning Optical Communications Wireless Ltd, Airport (IL)

(72) Inventor: Pavel Rozenbaum, Or Yehuda (IL)

(73) Assignee: Corning Optical Communications Wireless Ltd., Airport (IL)

( * ) Notice: Subject to any disclaimer, the term of this patent is extended or adjusted under 35 U.S.C. 154(b) by 0 days.

(21) Appl. No.: 14/061,037

(22) Filed: Oct. 23, 2013

(65) Prior Publication Data
US 2015/0109044 A1 Apr. 23, 2015

(51) Int. Cl.
*H03L 5/00* (2006.01)
*H03K 5/003* (2006.01)

(52) U.S. Cl.
CPC ..................................... *H03K 5/003* (2013.01)

(58) Field of Classification Search
None
See application file for complete search history.

(56) References Cited

U.S. PATENT DOCUMENTS

| 5,602,903 | A | 2/1997 | LeBlanc et al. | 379/60 |
|---|---|---|---|---|
| 5,873,040 | A | 2/1999 | Dunn et al. | 455/456 |
| 6,236,365 | B1 | 5/2001 | LeBlanc et al. | 342/457 |
| 6,249,252 | B1 | 6/2001 | Dupray | 342/450 |
| 6,876,945 | B2 | 4/2005 | Emord | 702/150 |
| 6,909,399 | B1 | 6/2005 | Zegelin et al. | 342/463 |
| 6,952,181 | B2 | 10/2005 | Karr et al. | 342/457 |
| 7,084,758 | B1 | 8/2006 | Cole | 340/539.11 |
| 7,183,910 | B2 | 2/2007 | Alvarez et al. | 340/539.13 |
| 7,194,275 | B2 | 3/2007 | Bolin et al. | 455/456.6 |
| 7,298,327 | B2 | 11/2007 | Dupray et al. | 342/451 |
| 7,315,735 | B2 | 1/2008 | Graham | 455/404.1 |

(Continued)

FOREIGN PATENT DOCUMENTS

| AU | 2010100320 A4 | 6/2010 |
|---|---|---|
| JP | 2009288245 | 12/2009 |

(Continued)

OTHER PUBLICATIONS

Girard, et al., Indoor Pedestrian Navigation Using Foot-Mounted IMU and Portable Ultrasound Range Sensors, www.mdpi.com/journal/sensors, Aug. 2, 2011, pp. 7606-7624.
Kim, et al, "Smartphone-Based Collaborative and Autonomous Radio Fingerprinting," IEEE Transactions On Systems, Man, and Cybernetics — Part C: Applications and Reviews, vol. 42, No. 1, Jan. 2012, pp. 112-122.
Mokni, et al., "Couples sonar inertial navigation system for pedestrian tracking," 8 pages, 2010.
"Safe Campus Solutions: Going Beyond Emergency Notification," www.alcatel-lucent.com, 8 pages, 2008.

(Continued)

*Primary Examiner* — Cassandra Cox
(74) *Attorney, Agent, or Firm* — C. Keith Montgomery (57) ABSTRACT

Embodiments disclosed include variable amplitude signal generators for generating a sinusoidal signal having limited direct current (DC) offset variation and related devices and methods. Instead of employing a single pulse width modulation (PWM) signal to generate a sinusoidal signal, in one embodiment, a circuit is provided that generates two PWM signals. The first PWM signal is a high-to-low PWM signal, where the active state is a lower signal level. The second PWM signal is a low-to-high PWM signal where active state is a higher signal level. The first and second PWM signals are combined to provide a summed signal, which is filtered to generate a sinusoidal signal. The DC offset of the first PWM signal varies inversely to the DC offset of the second PWM signal. In this manner, distortions caused by variations in the DC offset present in the generated sinusoidal signal are limited (i.e., reduced or eliminated).

11 Claims, 9 Drawing Sheets

(56) References Cited

U.S. PATENT DOCUMENTS

| | | | |
|---|---|---|---|
| 7,336,961 B1 | 2/2008 | Ngan | 455/456.1 |
| 7,395,181 B2 | 7/2008 | Foxlin | 702/155 |
| 7,525,484 B2 | 4/2009 | Dupray et al. | 342/450 |
| 7,535,796 B2 | 5/2009 | Holm et al. | 367/100 |
| 7,698,228 B2 | 4/2010 | Gailey et al. | 705/64 |
| 7,714,778 B2 | 5/2010 | Dupray | 342/357.01 |
| 7,751,971 B2 | 7/2010 | Chang et al. | 701/207 |
| 7,764,231 B1 | 7/2010 | Karr et al. | 342/457 |
| 7,848,765 B2 | 12/2010 | Phillips et al. | 455/456.3 |
| 7,860,518 B2 | 12/2010 | Flanagan et al. | 455/456.1 |
| 7,860,519 B2 | 12/2010 | Portman et al. | 455/456.3 |
| 7,903,029 B2 | 3/2011 | Dupray | 342/457 |
| 7,970,648 B2 | 6/2011 | Gailey et al. | 705/14.49 |
| 7,996,281 B2 | 8/2011 | Alvarez et al. | 705/27.2 |
| 8,005,050 B2 | 8/2011 | Scheinert et al. | 370/335 |
| 8,032,153 B2 | 10/2011 | Dupray et al. | 455/456.1 |
| 8,072,381 B1 | 12/2011 | Ziegler | 342/386 |
| 8,073,565 B2 | 12/2011 | Johnson | 700/245 |
| 8,081,923 B1 | 12/2011 | Larsen et al. | 455/18 |
| 8,082,096 B2 | 12/2011 | Dupray | 701/207 |
| 8,090,383 B1 | 1/2012 | Emigh et al. | 455/456.1 |
| 8,135,413 B2 | 3/2012 | Dupray | 455/456.1 |
| 8,213,264 B2 | 7/2012 | Lee et al. | 367/127 |
| 8,326,315 B2 | 12/2012 | Phillips et al. | 455/456.1 |
| 8,364,171 B2 | 1/2013 | Busch | 455/456.1 |
| 8,693,578 B2 * | 4/2014 | Kunihiro et al. | 375/300 |
| 8,774,843 B2 | 7/2014 | Mangold et al. | 455/456.1 |
| 2003/0146871 A1 | 8/2003 | Karr et al. | 342/457 |
| 2003/0157943 A1 | 8/2003 | Sabat, Jr. | 455/456 |
| 2004/0102196 A1 | 5/2004 | Weckstrom et al. | 454/456.1 |
| 2004/0198386 A1 | 10/2004 | Dupray | 455/456.1 |
| 2004/0246926 A1 | 12/2004 | Belcea et al. | 370/332 |
| 2005/0020309 A1 | 1/2005 | Moeglein et al. | 455/456.1 |
| 2005/0102180 A1 | 5/2005 | Gailey et al. | 705/14 |
| 2005/0143091 A1 | 6/2005 | Shapira et al. | 455/456.1 |
| 2005/0153712 A1 | 7/2005 | Osaka et al. | 455/456.5 |
| 2006/0014548 A1 | 1/2006 | Bolin et al. | 455/456.1 |
| 2006/0025158 A1 | 2/2006 | Leblanc et al. | 455/456.2 |
| 2006/0209752 A1 | 9/2006 | Wijngaarden et al. | 370/328 |
| 2006/0276202 A1 | 12/2006 | Moeglein et al. | 455/456.1 |
| 2007/0104128 A1 | 5/2007 | Laroia et al. | 370/329 |
| 2007/0104164 A1 | 5/2007 | Laroia et al. | 370/338 |
| 2007/0140168 A1 | 6/2007 | Laroia et al. | 370/330 |
| 2007/0202844 A1 | 8/2007 | Wilson et al. | 455/404.2 |
| 2007/0253355 A1 | 11/2007 | Hande et al. | 371/328 |
| 2007/0268853 A1 | 11/2007 | Ma et al. | 370/328 |
| 2008/0077326 A1 | 3/2008 | Funk et al. | 701/220 |
| 2008/0119208 A1 | 5/2008 | Flanagan et al. | 455/456.6 |
| 2008/0167049 A1 | 7/2008 | Karr et al. | 455/456.2 |
| 2008/0194226 A1 | 8/2008 | Rivas et al. | 455/404.2 |
| 2008/0201226 A1 | 8/2008 | Carlson et al. | 705/14 |
| 2008/0270522 A1 | 10/2008 | Souissi | 709/203 |
| 2009/0073885 A1 | 3/2009 | Jalil et al. | 370/241 |
| 2009/0163224 A1 | 6/2009 | Dean et al. | 455/456.1 |
| 2009/0176507 A1 | 7/2009 | Wu et al. | 455/456.2 |
| 2009/0191891 A1 | 7/2009 | Ma et al. | 455/456.1 |
| 2010/0007485 A1 | 1/2010 | Kodrin et al. | 340/539.13 |
| 2010/0121567 A1 | 5/2010 | Mendelson | 701/206 |
| 2010/0128568 A1 | 5/2010 | Han et al. | 367/99 |
| 2010/0130233 A1 | 5/2010 | Parker | 455/456.3 |
| 2010/0151821 A1 | 6/2010 | Sweeney et al. | 455/410 |
| 2010/0178936 A1 | 7/2010 | Wala et al. | 455/456.2 |
| 2010/0234045 A1 | 9/2010 | Karr et al. | 455/456.1 |
| 2010/0273504 A1 | 10/2010 | Bull et al. | 455/456.1 |
| 2010/0287011 A1 | 11/2010 | Muchkaev | 705/7 |
| 2010/0291949 A1 | 11/2010 | Shapira et al. | 455/456.1 |
| 2011/0019999 A1 | 1/2011 | George et al. | 398/58 |
| 2011/0028157 A1 | 2/2011 | Larsen | 455/456.1 |
| 2011/0028161 A1 | 2/2011 | Larsen | 455/456.1 |
| 2011/0035284 A1 | 2/2011 | Moshfeghi | 705/14.58 |
| 2011/0050501 A1 | 3/2011 | Aljadeff | 342/387 |
| 2011/0086614 A1 | 4/2011 | Brisebois et al. | 455/411 |
| 2011/0124347 A1 | 5/2011 | Chen et al. | 455/456.1 |
| 2011/0159876 A1 | 6/2011 | Segall et al. | 45/442 |
| 2011/0159891 A1 | 6/2011 | Segall et al. | 455/456.3 |
| 2011/0171912 A1 | 7/2011 | Beck et al. | 455/67.11 |
| 2011/0171946 A1 | 7/2011 | Soehren | 455/418 |
| 2011/0171973 A1 | 7/2011 | Beck et al. | 455/456.2 |
| 2011/0210843 A1 | 9/2011 | Kummetz | 340/517 |
| 2011/0244887 A1 | 10/2011 | Dupray et al. | 455/456.2 |
| 2011/0279445 A1 | 11/2011 | Murphy et al. | 345/419 |
| 2011/0321340 | 12/2011 | Wu et al. | 455/456.1 |
| 2012/0028649 A1 | 2/2012 | Gupta et al. | 455/456.1 |
| 2012/0039320 A1 | 2/2012 | Lemson et al. | 370/338 |
| 2012/0046049 A1 | 2/2012 | Curtis et al. | 455/456.3 |
| 2012/0058775 A1 | 3/2012 | Dupray et al. | 455/456.1 |
| 2012/0072106 A1 | 3/2012 | Han et al. | 701/410 |
| 2012/0081248 A1 | 4/2012 | Kennedy et al. | 342/118 |
| 2012/0084177 A1 | 4/2012 | Tanaka et al. | 705/26.41 |
| 2012/0087212 A1 | 4/2012 | Vartanian et al. | 367/118 |
| 2012/0095779 A1 | 4/2012 | Wengrovitz et al. | 705/3 |
| 2012/0108258 A1 | 5/2012 | Li | 455/456.1 |
| 2012/0130632 A1 | 5/2012 | Bandyopadhyay et al. | 701/446 |
| 2012/0135755 A1 | 5/2012 | Lee et al. | 455/456.2 |
| 2012/0158297 A1 | 6/2012 | Kim et al. | 701/516 |
| 2012/0158509 A1 | 6/2012 | Zivkovic et al. | 705/14.58 |
| 2012/0179548 A1 | 7/2012 | Sun et al. | 705/14.58 |
| 2012/0179549 A1 | 7/2012 | Sigmund et al. | 705/14.58 |
| 2012/0179561 A1 | 7/2012 | Sun et al. | 705/26.3 |
| 2012/0196626 A1 | 8/2012 | Fano et al. | 455/456.3 |
| 2012/0215438 A1 | 8/2012 | Liu et al. | 701/409 |
| 2012/0221392 A1 | 8/2012 | Baker et al. | 705/14.17 |
| 2012/0232917 A1 | 9/2012 | Al-Khudairy et al. | 705/2 |
| 2012/0243469 A1 | 9/2012 | Klein | 370/328 |
| 2012/0303446 A1 | 11/2012 | Busch | 705/14.45 |
| 2012/0303455 A1 | 11/2012 | Busch | 705/14.57 |
| 2012/0309752 A1 | 12/2012 | Liepa et al. | 367/99 |
| 2012/0310836 A1 | 12/2012 | Eden et al. | 705/44 |
| 2013/0006663 A1 | 1/2013 | Bertha et al. | 705/3 |
| 2013/0006849 A1 | 1/2013 | Morris | 705/39 |
| 2013/0036012 A1 | 2/2013 | Lin et al. | 705/14.58 |
| 2013/0040654 A1 | 2/2013 | Pairsh | 455/456.1 |
| 2013/0045758 A1 | 2/2013 | Khorashadi et al. | 455/456.3 |
| 2013/0046691 A1 | 2/2013 | Culton | 705/44 |
| 2013/0066821 A1 | 3/2013 | Moore et al. | 706/45 |
| 2013/0073336 A1 | 3/2013 | Heath | 705/7.29 |
| 2013/0073377 A1 | 3/2013 | Heath | 705/14.39 |
| 2013/0073388 A1 | 3/2013 | Heath | 705/14.53 |
| 2013/0073422 A1 | 3/2013 | Moore et al. | 705/26.7 |
| 2013/0080578 A1 | 3/2013 | Murad et al. | 709/217 |
| 2013/0084859 A1 | 4/2013 | Azar | 455/435.1 |
| 2013/0322415 A1 | 12/2013 | Chamarti et al. | 370/338 |
| 2014/0323150 A1 | 10/2014 | Mangold et al. | 455/456.1 |

FOREIGN PATENT DOCUMENTS

| | | | |
|---|---|---|---|
| WO | WO2008/099383 A2 | 8/2008 | |
| WO | WO2008/099390 A3 | 8/2008 | |
| WO | WO2009/081376 A3 | 7/2009 | |
| WO | WO2009/097237 A1 | 8/2009 | |
| WO | WO2011/017700 A1 | 2/2011 | |
| WO | WO2011/091859 A1 | 8/2011 | |
| WO | WO2011/123336 A1 | 10/2011 | |

OTHER PUBLICATIONS

"Cellular Specialties Introduces the First Simulcasted In-building Location-Based Tracking Solution," http://smart-grid.tmcnet.com/news/2009/09/14/4368300.htm, 2 pages.

Gansemer, et al., "RSSI-based Euclidean Distance Algorithm for Indoor Positioning Adapted for use in dynamically changing WLAN environments and multi-level buildings," 2010 International Conference on Indoor Positioning and Indoor Navigation(IPIN), Sep. 15-17, 2010, 6 pages.

Patent Cooperation Treaty, International Search Report for PCT/US2013/043107, Sep. 9, 2013, 5 pages.

Patent Cooperation Treaty, International Preliminary Report on Patentability for PCT/US2013/043107, Dec. 1, 2014, 8 pages.

* cited by examiner

VARIABLE AMPLITUDE SIGNAL GENERATORS FOR GENERATING A SINUSOIDAL SIGNAL HAVING LIMITED DIRECT CURRENT (DC) OFFSET VARIATION, AND RELATED DEVICES, SYSTEMS, AND METHODS

BACKGROUND

The technology of the disclosure relates generally to signal generation, and in particular to providing devices, systems, and methods to generate sinusoidal signals.

A sinusoidal signal is a signal that oscillates between a high and low value in a sine or cosine shaped waveform. Sinusoidal signals are frequently used to represent physical phenomenon such as the movement of a weight on a spring or the shape of a sound wave. Sinusoidal signals are also commonly used in electronic applications such as power transmission (AC current) and communications. In electronic systems, a sinusoidal signal generator can be employed to generate a sinusoidal signal.

Figure 1:
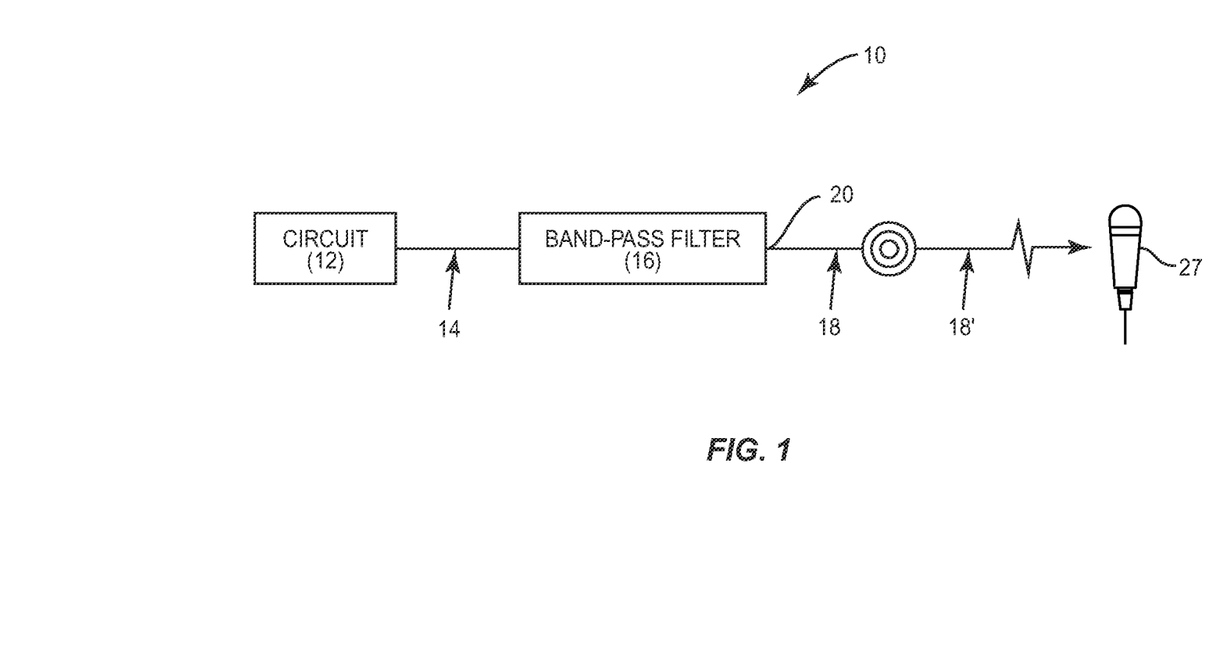
FIG. 1 is a schematic diagram of a conventional Pulse Width Modulation (PWM) sinusoidal signal generator.
Figure 2A:
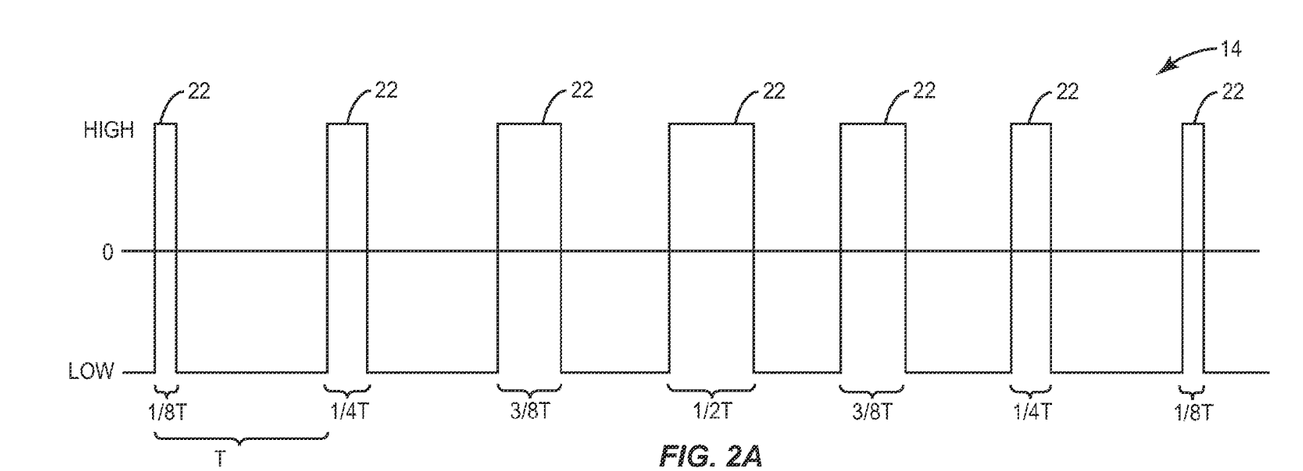
FIG. 2A illustrates a PWM signal with a varying duty cycle that can be filtered into a variable amplitude sinusoidal signal by the variable amplitude sinusoidal signal generator in FIG. 1.
Figure 2B:
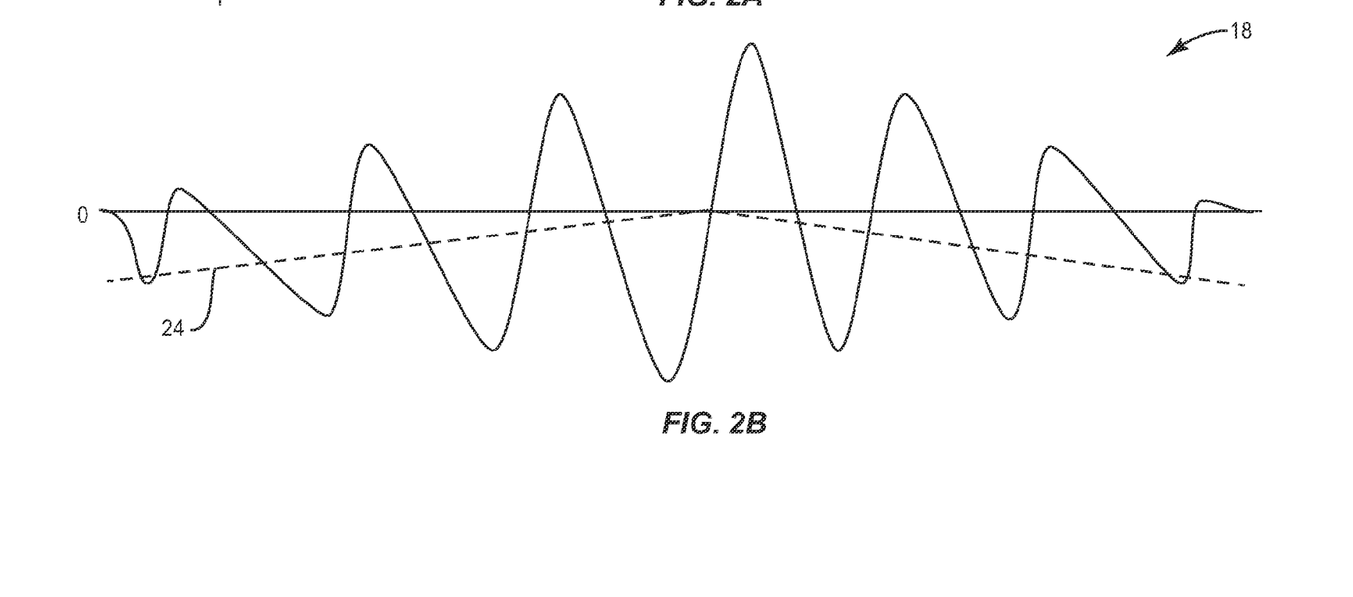
FIG. 2B illustrates a variable amplitude sinusoidal signal generated by the variable amplitude sinusoidal signal generator in FIG. 1 from the PWM signal in FIG. 2A, wherein the variable amplitude sinusoidal signal has a varying direct current (DC) offset.

A common approach to generating a sinusoidal signal is to use a Pulse Width Modulation (PWM) signal. The PWM signal can be filtered through a band-pass filter or low-pass filter to create a sinusoidal signal. This is illustrated by example in the sinusoidal signal generator 10 in FIG. 1. As illustrated in FIG. 1, the sinusoidal signal generator includes a circuit 12 that is configured to generate a PWM signal 14. An example of the PWM signal 14 is illustrated in FIG. 2A. The PWM signal 14 is input into a band-pass filter 16 that generates a resulting sinusoidal signal 18 on filter output 20. The PWM signal 14 provides frequency and amplitude control of the sinusoidal signal 18. The frequency of the generated sinusoidal signal 18 is the frequency of the PWM signal 14. The frequency of the PWM signal 14 is the frequency of alternations between an inactive state and an active state. In the PWM signal 14, the inactive state is a low signal level and the active state is a high signal level. This combination is referred to as a low-to-high PWM signal. In a high-to-low PWM signal, the inactive state is a high signal level and the active state is a low signal level. When the signal level is in the active state, pulses 22 are generated in the PWM signal 14, as illustrated in FIG. 2A. The amplitude of the generated sinusoidal signal 18 is controlled by the duty cycle of the PWM signal 14, as illustrated in FIG. 2B. The duty cycle of the PWM signal 14 is the percentage of time that a pulse 22 appears in a given period T of a PWM signal 14. The direct current (DC) offset 24 of the sinusoidal signal 18 in FIG. 2B is the average value of the PWM signal 14 in FIG. 2A. In other words, the DC offset 24 of the sinusoidal signal 18 is equal to INACTIVE+D(ACTIVE−INACTIVE), where ACTIVE and INACTIVE are the signal levels corresponding to the active state and the inactive state of the PWM signal 14, respectively, and D is the duty cycle of the PWM signal 14.

There are many applications which require a sinusoidal signal that has an amplitude gradually changing from a zero signal level to some maximal signal level and then back to a zero signal level. One example of such application is ultrasonic localization. In ultrasonic localization applications, beacons may be placed in various locations and emit an ultrasonic sound wave, such as by wireless transmission of the generated sinusoidal signal 18 over speaker 26 as wireless generated sinusoidal signal 18', as shown in FIG. 1. An electronic device may determine its location by receiving these sound signals, such as the wireless generated sinusoidal signal 18' received through a microphone 27 in FIG. 1, and performing time of flight calculations. The ultrasound localization beacons may transmit a sinusoidal signal that has an amplitude gradually changing from a zero signal level to some maximal signal level and then back to a zero signal level.

Thus, with reference back to FIG. 2B, if it is desired to vary the amplitude of the sinusoidal signal 18 from a zero signal level 0 to a desired maximal signal level M, and then back to the zero signal level 0, the duty cycle of the PWM signal 14 in FIG. 2A should be controlled to vary from a zero duty cycle to a desired maximal duty cycle (e.g., 50%) and then back to a zero duty cycle. This creates a DC offset 24 that starts at low level and gradually increases while the duty cycle of the PWM signal 14 increases. This variation in the DC offset 24 creates distortion in the sinusoidal signal 18 that can cause distortion in other components of a system employing the sinusoidal signal 18.

No admission is made that any reference cited herein constitutes prior art. Applicant expressly reserves the right to challenge the accuracy and pertinency of any cited documents.

SUMMARY

Embodiments disclosed herein include variable amplitude signal generators for generating a sinusoidal signal having limited direct current (DC) offset variation, and related devices, systems, and methods. A pulse width modulation (PWM) signal can be used to generate a sinusoidal signal. The duty cycle of the PWM signal can be varied to vary the amplitude in the generated sinusoidal signal, if desired. In an embodiment disclosed herein, instead of employing a single PWM signal to generate a sinusoidal signal, in one embodiment, a circuit is provided that generates two PWM signals. The first PWM signal is a high-to-low PWM signal, where the inactive state is a higher signal level and the active state is a lower signal level. The second PWM signal is a low-to-high PWM signal, where the inactive state is a lower signal level and the active state is a higher signal level. The first and second PWM signals are combined to provide a summed signal. The summed signal is then filtered to generate a sinusoidal signal. Because the first and second PWM signals have inverse active state signal levels, the DC offset of the first PWM signal will vary inversely to the DC offset of the second PWM signal. Thus, the DC offsets of the first and second PWM signals will destructively interfere with each other to limit the variation of the combined DC offset in the generated sinusoidal signal. In this manner, distortions caused by variations in the DC offset present in the generated sinusoidal signal will be limited (i.e., reduced or eliminated).

In this regard, one embodiment of the disclosure relates to a variable amplitude signal generator for generating a sinusoidal signal having limited DC offset variation. The signal generator comprises a circuit configured to generate a first PWM signal where the first PWM signal is a high-to-low PWM signal, and to generate a second PWM signal where the second PWM signal is a low-to-high PWM signal. The second PWM signal is out of phase with the first PWM signal. The signal generator also comprises a combiner node configured to receive and combine the first PWM signal and the second PWM signal into a summed signal, and a filter configured to receive the summed signal and filter the received summed signal into a sinusoidal signal having limited DC offset variation.

An additional embodiment relates to a method of generating a sinusoidal signal having limited DC offset variation comprising generating a first PWM signal, where the first PWM signal is a high-to-low PWM signal, and generating a second PWM signal, where the second PWM signal is a low-to-high PWM signal. The second PWM signal is out of phase with the first PWM signal. The method also comprises combining the first PWM signal and the second PWM signal into a summed signal, and filtering the summed signal into a sinusoidal signal having limited DC offset variation.

Additional features and advantages are set forth in the detailed description and drawings.

The foregoing general description and the following detailed description are merely exemplary, and are intended to provide an overview or framework to understand the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Various embodiments will be further clarified by the following examples.

Embodiments disclosed herein include variable amplitude signal generators for generating a sinusoidal signal having limited direct current (DC) offset variation. Related devices, systems, and methods are also disclosed. A pulse width modulation (PWM) signal can be used to generate a sinusoidal signal. The duty cycle of the PWM signal can be varied to vary the amplitude in the generated sinusoidal signal, if desired. In an embodiment disclosed herein, instead of employing a single PWM signal to generate a sinusoidal signal, in one embodiment, a circuit is provided that generates two PWM signals. The first PWM signal is a high-to-low PWM signal, where the inactive state is a higher signal level and the active state is a lower signal level. The second PWM signal is a low-to-high PWM signal, where the inactive state is a lower signal level and the active state is a higher signal level. The first and second PWM signals are combined to provide a summed signal. The summed signal is then filtered to generate a sinusoidal signal. Because the first and second PWM signals have inverse active state signal level, the DC offset of the first PWM signal will vary inversely to the DC offset of the second PWM signal. Thus, the DC offsets of the first and second PWM signals will destructively interfere with each other to limit the variation of the combined DC offset in the generated sinusoidal signal. In this manner, distortions caused by variations in the DC offset present in the generated sinusoidal resulting from amplitude variations will be limited (i.e., reduced or eliminated).

Figure 3:
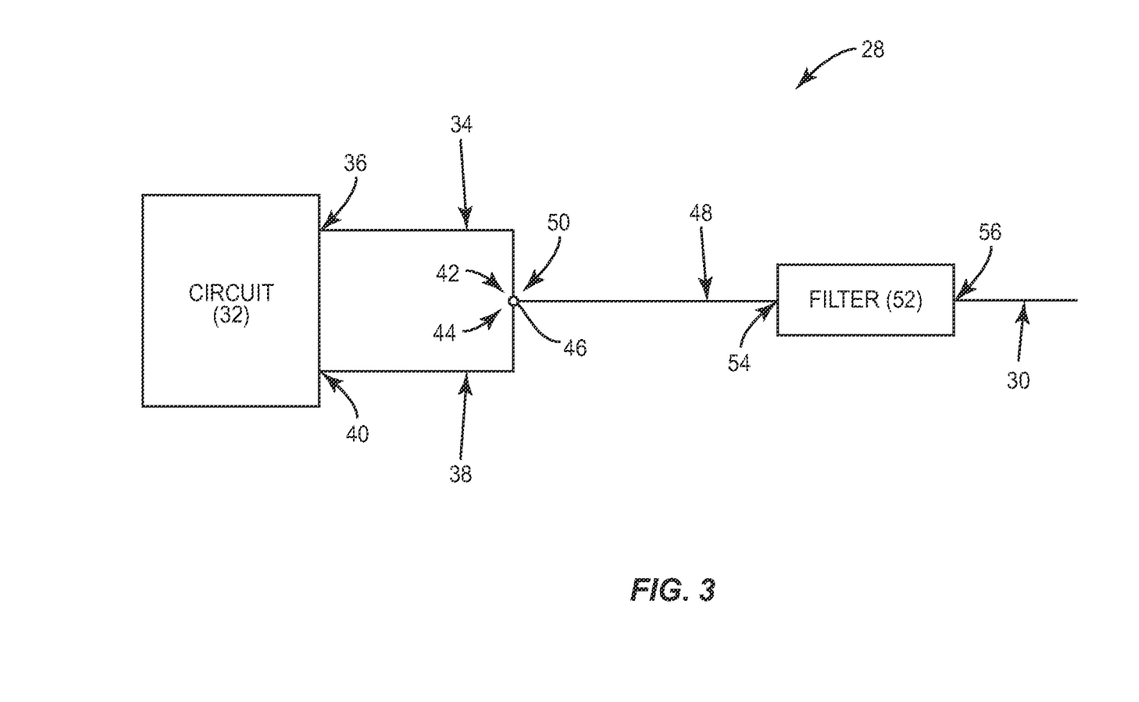
FIG. 3 is a schematic diagram of an exemplary variable amplitude sinusoidal signal generator configured to combine a first high-to-low PWM signal with a second low-to-high PWM signal phase offset from the first PWM signal to generate a sinusoidal signal having a limited DC offset variation.

In this regard, FIG. 3 is a schematic diagram of an exemplary variable amplitude sinusoidal signal generator 28 for generating a sinusoidal signal 30 having limited DC offset variation. The variable amplitude sinusoidal signal generator 28 is also referred to herein as "sinusoidal signal generator 28." The sinusoidal signal generator 28 employs a circuit 32 configured to generate a first PWM signal 34 on a first output 36 and a second PWM signal 38 on a second output 40. As will be discussed in more detail below, the first PWM signal 34 and the second PWM signal 38 are received at a first input 42 and second input 44 of a combiner node 46, respectively. The first PWM signal 34 and the second PWM signal 38 are combined with each other to form a summed signal 48 on a combiner node output 50. A filter 52 is also provided and configured to receive the summed signal 48 from the combiner node 46 on a filter input 54. The filter 52 is configured to filter the received summed signal 48 on the filter input 54 into a filtered summed signal on filter output 56, which is the sinusoidal signal 30 in this example.

As will be discussed below, the duty cycles of the first PWM signal 34 and second PWM signal 38 generated by the circuit 32 in FIG. 3 are varied such that the resulting sinusoidal signal 30 has a varying amplitude. As will also be discussed in more detail below, the first PWM signal 34 generated by the circuit 32 is a high-to-low PWM signal, and the second PWM signal 38 generated by the circuit 32 is a low-to-high PWM signal. Thus, the DC offset of the first PWM signal 34 is inversely related to the DC offset of the second PWM signal 38 for a given variation in duty cycle. Therefore, when the first PWM signal 34 and the second PWM signal 38 are summed at the combiner node 46, the DC offsets of the first and second PWM signals 34, 38 will destructively interfere with each other to limit the variation of the combined DC offset in the generated sinusoidal signal 30. In this manner, distortions caused by variations in the DC offset present in the generated sinusoidal signal 30 resulting from amplitude variations will be limited.

Figures 4A, 4B:
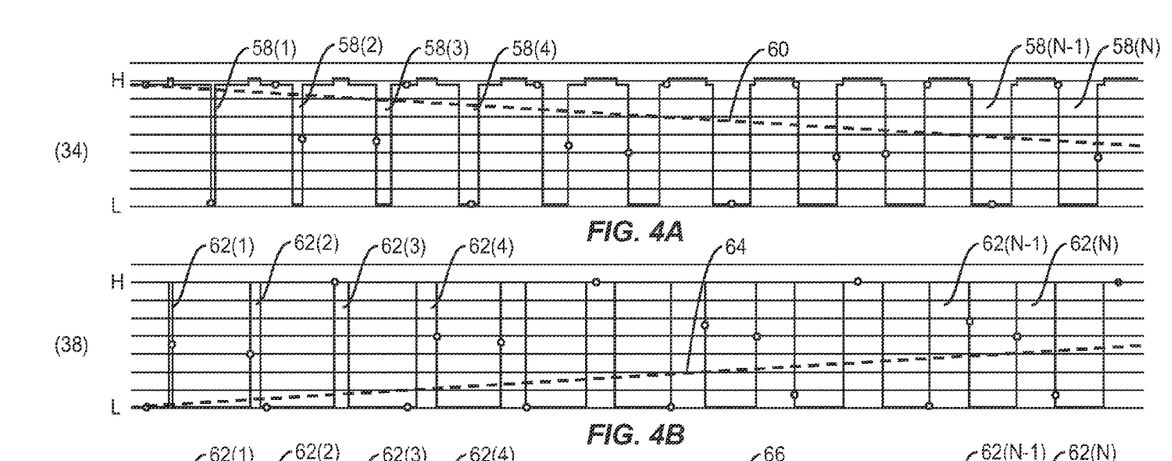
FIGS. 4A and 4B illustrate an exemplary first high-to-low PWM signal and an exemplary second low-to-high PWM signal phase offset from the first PWM signal, respectively, each having a varying duty cycle, that can be combined by the variable amplitude sinusoidal signal generator in FIG. 3 to generate a sinusoidal signal having a limited DC offset variation.

To further explain how a first PWM signal 34 can be provided that has a DC offset inversely related to the DC offset of the second PWM signal 38 for a given variation in duty cycle, FIGS. 4A-4D are provided. FIG. 4A illustrates an example of the first PWM signal 34 that can be generated by the circuit 32 in FIG. 3. The first PWM signal 34 is comprised of a plurality of pulses 58, which are illustrated in FIG. 4A individually as pulses 58(1)-58(N). The pulses 58 in the first PWM signal 34 are each defined by the change in amplitude from a high signal level H to a low signal level L, as illustrated in FIG. 4A. Thus, the first PWM signal 34 is a high-to-low PWM signal, meaning the inactive state is at higher signal level (e.g., high signal level H in FIG. 4A) where the pulses 58 are not present, and the active state is at a lower signal level (e.g., low signal level L in FIG. 4A), where the pulses 58 are present.

With continuing reference to FIG. 4A, because it is desired to vary the amplitude of the generated sinusoidal signal 30 in FIG. 3, the pulses 58 in the first PWM signal 34 are provided having gradually increasing duty cycles. For example, a second pulse 58(2) following a first pulse 58(1) in the first PWM signal 34 has a larger duty than the duty cycle of the first pulse 58(1). Subsequent pulses 58(3), 58(4), . . . 58(N) in the first PWM signal 34 have further increasing duty cycles until a duty cycle of approximately fifty percent (50%) is reached in pulse 58(N) in this example. Note that the duty cycle of the first PWM signal 34 could increase up to one hundred percent (100%), if desired. This increasing duty cycle in the first PWM signal 34 will cause amplitude of the generated sinusoidal signal 30 to increase proportionally. As discussed above, it may be desired to provide for the circuit 32 to vary the duty cycle of the first PWM signal 34 to be used to generate a varying amplitude sinusoidal signal. The first PWM signal 34 has a DC offset 60 (i.e., a DC component) illustrated in FIG. 4A that is the average signal level of the first PWM signal 34. The DC offset 60 of the first PWM signal 34 varies over time gradually decreasing as illustrated in FIG. 4A, because the duty cycle of the high-to-low first PWM signal 34 is gradually increasing. If the first PWM signal 34 was the signal filtered by filter 52 to generate a sinusoidal signal, the generated sinusoidal signal would also have a DC offset that would vary proportionally. This variation in the DC offset could create distortion in the sinusoidal signal that can cause distortion in other components of a system employing the sinusoidal signal.

Thus, to limit the variation in DC offset in the sinusoidal signal 30 generated by the sinusoidal signal generator 28 in FIG. 3, the second PWM signal 38 is also generated by the circuit 32 and combined with the first PWM signal 34. FIG. 4B illustrates an example of the second PWM signal 38 that can be generated by the circuit 32 in FIG. 3. The second PWM signal 38 is also comprised of a plurality of pulses 62, which are illustrated in FIG. 4B individually as pulses 62(1)-62(N). Opposite of the pulses 58 in the first PWM signal 34, the pulses 62 in the second PWM signal 38 are each defined by the change in amplitude from a low signal level L to a high signal level H, as illustrated in FIG. 4B. Thus, the second PWM signal 38 is a low-to-high PWM signal, meaning the inactive state is at a lower signal level (e.g., low signal level L in FIG. 4B) where the pulses 62 are not present, and the active state is at a higher signal level (e.g., high signal level H in FIG. 4B), where the pulses 62 are present. The circuit 32 generates the pulses 62 of the second PWM signal 38 phase offset (i.e., offset in time) from the pulses 58 of the first PWM signal 34, so that the pulses 58 and 62 do not cancel each other when combined at the combiner node 46 in FIG. 3.

Because, as previously discussed, it is desired to vary the amplitude of the generated sinusoidal signal 30 in FIG. 3, the pulses 62 in the second PWM signal 38 are also provided having gradually increasing duty cycles. For example, a second pulse 62(2) following a first pulse 62(1) in the second PWM signal 38 has a larger duty cycle than the duty cycle of the first pulse 62(1). Subsequent pulses 62(3), 62(4), . . . 62(N) in the second PWM signal 38 also have further increasing duty cycles until a duty cycle of approximately fifty percent (50%) is reached in pulse 62(N) in this example. Note that the duty cycle of the second PWM signal 38 could be increased up to one hundred percent (100%), if desired, but note that increasing the duty cycle above fifty percent (50%) will decrease amplitude. In this embodiment, the duty cycle of the of the second PWM signal 38 should be changed equally with the duty cycle of the first PWM signal 34 to minimize signal distortion in the generated sinusoidal signal 30. The second PWM signal 38 also has a DC offset 64 (i.e., a DC component) illustrated in FIG. 4B that is the average signal level of the second PWM signal 38. The DC offset 64 of the second PWM signal 38 varies over time gradually increasing as illustrated in FIG. 4B, because the duty cycle of the low-to-high second PWM signal 38 is gradually increasing.

Figure 4C:
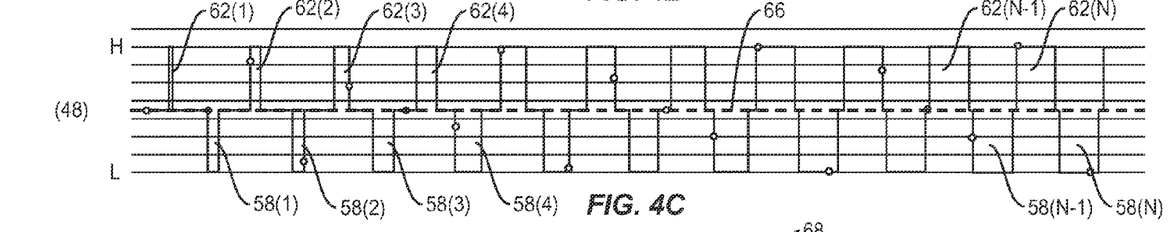
FIGS. 4C and 4D illustrate an exemplary summed PWM signal resulting from the combined first and second PWM signals in FIGS. 4A and 4B, and generated sinusoidal signal resulting from filtering of the summed PWM signal, respectively.

Thus, as illustrated in FIGS. 4A and 4B, the DC offsets 60, 64 of the first and second PWM signals 34, 38, respectively, vary inversely to each other. Thus, the first and second PWM signals 34, 38 are combined into the summed signal 48, as illustrated in FIG. 4C, which is filtered by filter 52 into the sinusoidal signal 30 illustrated in FIG. 4D. The DC offsets 60, 64 of the first and second PWM signals 34, 38 illustrated in FIGS. 4A and 4B, respectively, will destructively interfere with each other to limit the variation of a combined DC offset 66 in the summed signal 48 in FIG. 4C. Ideally, the circuit 32 will generate the first and second PWM signals 34, 38 such that their respective DC offsets 60, 64 will vary exactly inversely to each other to provide a constant DC offset 66 in the summed signal 48 resulting in a constant DC offset 68 in the sinusoidal signal 30. In this manner, distortions caused by variations in the DC offset present in the generated sinusoidal signal 30 resulting from amplitude variations will be limited or avoided. Even if first and second PWM signals 34, 38 generated by the circuit 32 are not exactly inversely proportional to each other, the DC offset 66 in the summed signal 48 and as a result, the DC offset 68 in the sinusoidal signal 30, will have limited variation. This is opposed to either using the first PWM signal 34 or the second PWM signal 38 alone to generate a sinusoidal signal, which would include a varying DC offset according to the variation in the DC offset 60 or 64, respectively.

Figure 4D:
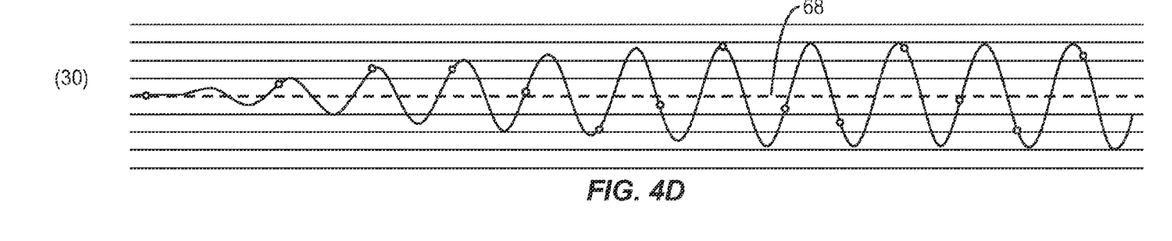

It is noted that the amplitude of the generated sinusoidal signal 30 varies over time, as illustrated in FIG. 4D, because the duty cycle of the pulses 58, 62 in the summed signal 48 vary over time, as discussed above and illustrated in FIGS. 4A and 4B, respectively. The amplitude of the generated sinusoidal signal 30 varies by gradually increasing over time, but the circuit 32 could also be configured to generate the first and second PWM signals 34, 38 such that their duty cycles decrease over time, thus decreasing the amplitude of the generated sinusoidal signal 30 over time.

It is also noted in this example that the first PWM signal 34 in FIG. 4A and the second PWM signal 38 in FIG. 4B are phase offset by one half cycle. In other words, the pulses 58 of the first PWM signal 34 are generated by the circuit 32 in time half way between the pulses 62 of the second PWM signal 38, and vice versa. In this manner, the pulses 58 from the first PWM signal 34 present in the summed signal 48 are located in time half way between the pulses 62 from the second PWM signal 38, present in the summed signal 48, as illustrated in FIG. 4C. Thus, the shape of the generated sinusoidal signal 30 will not be distorted or less distorted from an ideal sine wave shape that would otherwise be present if the pulses 58 of the first PWM signal 34 are and the pulses 62 of the second PWM signal 38 were phase offset in time (i.e., to avoid cancellation), but not phase offset at half cycle from each other.

Further, note that the duty cycles of the first and second PWM signals 34, 38 in FIGS. 4A and 4B are generated by the circuit 32 to be equal at any given time. However, this is not required. The circuit 32 may also be configured to generate the first and second PWM signals 34, 38 in FIGS. 4A and 4B such that their respective duty cycles are not equal at any given point in time. If unequal, the DC offsets 60, 64 in the respective first and second PWM signals 34, 38 will not be equally inversely related to each other thus causing some variation to exist in the DC offset 66 of the summed signal 48 and, as a result, the generated sinusoidal signal 30. The duty cycle of the second PWM signal 38 can be changed equally with the duty cycle of the first PWM signal 34 to minimize signal distortion in the generated sinusoidal signal 30.

Figure 5:
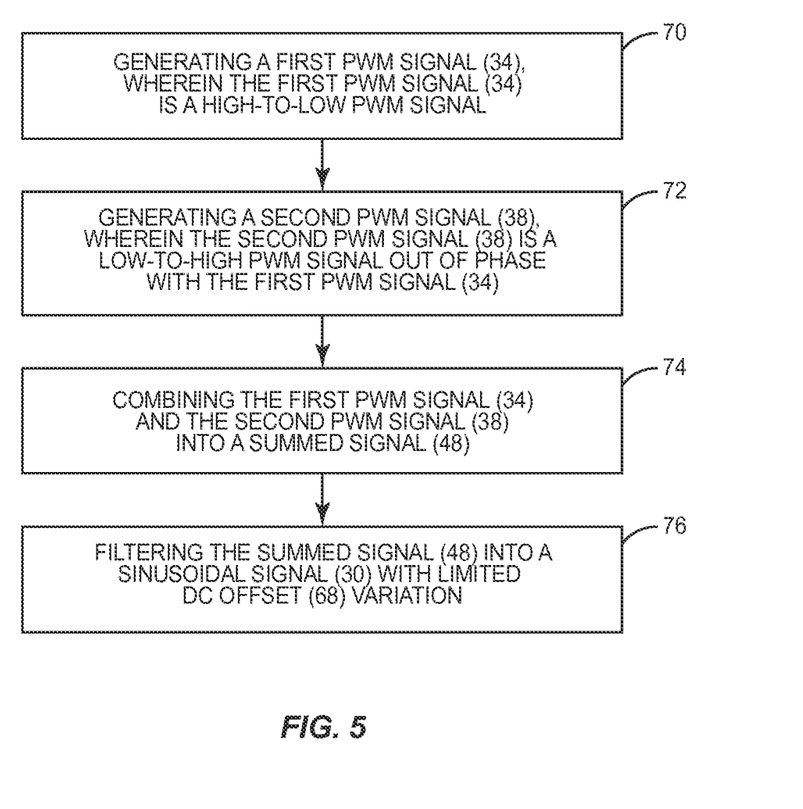
FIG. 5 is a flowchart illustrating an exemplary process of the variable amplitude sinusoidal signal generator in FIG. 3 generating a sinusoidal signal having a limited DC offset variation.

FIG. 5 is a flowchart illustrating an exemplary process of the variable amplitude sinusoidal signal generator 28 in FIG. 3 generating the sinusoidal signal 30 having a DC offset 68 that is limited in variation. In this regard, as discussed above, to generate the sinusoidal signal 30, the circuit 32 generates the first PWM signal 34 as a high-to-low PWM signal having a varying, generally increasing duty cycle (block 70). The circuit 32 also generates the second PWM signal 38 as a low-to-high PWM signal also having a varying, generally increasing duty cycle, as discussed above (block 72). As discussed above, the second PWM signal 38 is generated by the circuit 32 to be half cycle phase offset from the first PWM signal 34. The first and second PWM signals 34, 38 are received and combined at combiner node 46 into the summed signal 48 (block 74). The summed signal 48 is then filtered into the sinusoidal signal 30 having the DC offset 68 that is limited in variation (block 76).

In the sinusoidal signal generator 28 in FIG. 3, the power level of the generated sinusoidal signal 30 is based on the power level of the first and second PWM signal 34, 38 generated by the circuit 32. However, the power level of the generated sinusoidal signal 30 may need to be different than the power levels of the first PWM signal 34 and the second PWM signal 38. Furthermore, there may be power loss between the various elements of the variable amplitude sinusoidal signal generator 28 and the recipient component of the generated sinusoidal signal 30 that makes the power level of the generated sinusoidal signal 30 unsuited for use by the recipient component.

Figure 6:
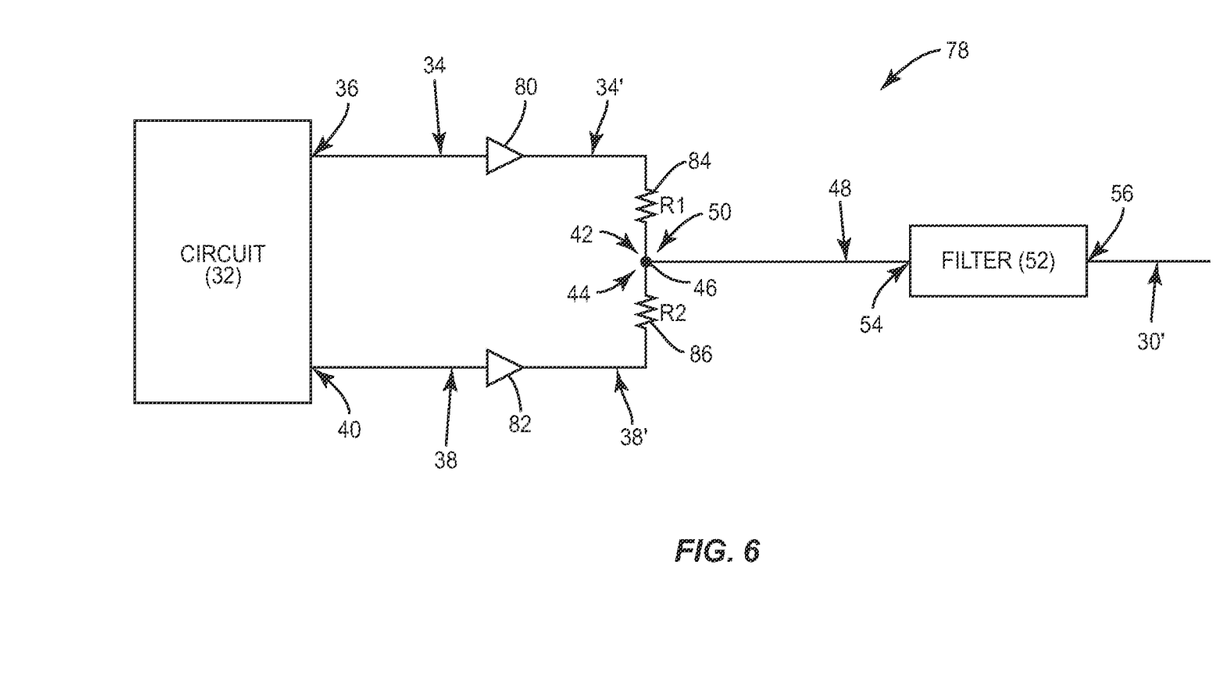
FIG. 6 is a circuit diagram of another variable amplitude sinusoidal signal generator configured to combine a first high-to-low PWM signal with a second low-to-high PWM signal phase offset from the first PWM signal to generate a sinusoidal signal having a limited DC offset variation.

In this regard, FIG. 6 is a circuit diagram of another variable amplitude sinusoidal signal generator 78. The variable amplitude sinusoidal signal generator 78 is also referred to herein as "sinusoidal signal generator 78." The variable amplitude sinusoidal signal generator 78 is similar to the sinusoidal signal generator 28 in FIG. 3, but as discussed below, is capable of amplifying the first and second PWM signal 34, 38 before being combined. Thus, the sinusoidal signal generator 78 is configured to generate an amplified sinusoidal signal 30' having limited DC offset variation. Common components are indicated by common element numbers between FIGS. 3 and 6.

With reference to FIG. 6, the sinusoidal signal generator 78 employs a circuit 32 configured to generate a first PWM signal 34 on a first output 36 and a second PWM signal 38 on a second output 40. These signals are the same signals as the first and second PWM signals 34, 38 as in FIG. 3 in this example, but such is not required. The sinusoidal signal generator 78 employs a first driving circuit 80 that receives the first PWM signal 34 and generates a first amplified PWM signal 34' by raising the first PWM signal 34 to a first power level. For example, the first driving circuit 80 may be a transistor, operational amplifier, or logic gate(s) as non-limiting examples. The sinusoidal signal generator 78 also employs a second driving circuit 82 that receives the second PWM signal 38 and generates a second amplified PWM signal 38' by raising the second PWM signal 38 to a second power level. For example, the second driving circuit 82 may also be a transistor, operational amplifier, or logic gate(s) as non-limiting examples. The first and second amplified PWM signals 34', 38' are similar to the first and second PWM signals 34, 38 as shown in FIGS. 4A-4B, respectively, except that the first and second amplified PWM signals 34', 38' may have more power as a result of the amplification of the first and second PWM signals 34, 38 from the first and second driving circuits 80, 82.

The first amplified PWM signal 34' and the second amplified PWM signal 38' are received at a first input 42 and second input 44 of a combiner node 46, respectively. The first amplified PWM signal 34' and the second amplified PWM signal 38' are combined with each other to form an amplified summed signal 48' on a combiner node output 50. In this exemplary embodiment, the sinusoidal signal generator 78 also includes a first resistor 84 on the path between the first driving circuit 80 and the combiner node 46 and a second resistor 86 on the path between the second driving circuit 82 and the combiner node 46. These first and second resistors 84, 86 present a load to the first amplified PWM signal 34' and the second amplified PWM signal 38'. The first and second resistors 84, 86 may also be used to provide impedance matching for the first and second amplified PWM signals 34', 38' as they arrive at the first and second inputs 42, 44 of the combiner node 46, respectively. Note that the first and second resistors 84, 86 may not be a single resistor or resistor network, as desired.

With continuing reference to FIG. 6, the filter 52 is also provided and configured to receive the amplified summed signal 48' from the combiner node 46 on a filter input 54. The filter 52 is configured to filter the received amplified summed signal 48' on the filter input 54 into a filtered amplified summed signal on filter output 56, which is the amplified sinusoidal signal 30' in this example.

As discussed above for the circuit 32 in the sinusoidal signal generator 28 in FIG. 3, the duty cycles of the first PWM signal 34 and second PWM signal 38 generated by the circuit 32 in FIG. 6 may be varied such that the resulting amplified sinusoidal signal 30' has a varying amplitude. The first PWM signal 34 generated by the circuit 32 is a high-to-low PWM signal. The second PWM signal 38 generated by the circuit 32 is a low-to-high PWM signal. Thus, the DC offset of the first PWM signal 34 is inversely related to the DC offset of the second PWM signal 38 for a given variation in duty cycle.

The amplification provided by the first and second driving circuits 80, 82 in FIG. 6 amplifies the value of the DC offsets of the first and second amplified PWM signals 34', 38', but the amplification does not affect the variation of the DC offsets. Therefore, when the first amplified PWM signal 34' and the second amplified PWM signal 38' are summed at the combiner node 46, the DC offsets of the first and second amplified PWM signals 34', 38' will destructively interfere with each other to limit the variation of the combined DC offset in the generated amplified sinusoidal signal 30'. In this manner, distortions caused by variations in the DC offset present in the generated amplified sinusoidal signal 30' resulting from amplitude variations will be limited. As was previously discussed with regard to the first and second amplified PWM signals 34', 38', the amplified summed signal 48' and the amplified sinusoidal signal 30' are similar to the summed signal 48 and the sinusoidal signal 30 as shown in FIGS. 4C-4D, respectively, except that the amplified summed signal 48' and the amplified sinusoidal signal 30' may have more power as a result of the amplification from the first and second driving circuits 80, 82.

Note that the variable amplitude sinusoidal signal generator 78, as shown in FIG. 6, is only one example of a variation in the variable amplitude sinusoidal signal generator 28, as shown in FIG. 3. Other embodiments are possible. For example, the circuit 32 configured to generate the first and second PWM signals 34, 38, as is shown in FIGS. 3 and 6, can be configured in many different manners. Two non-limiting examples of this are discussed below.

Figure 7:
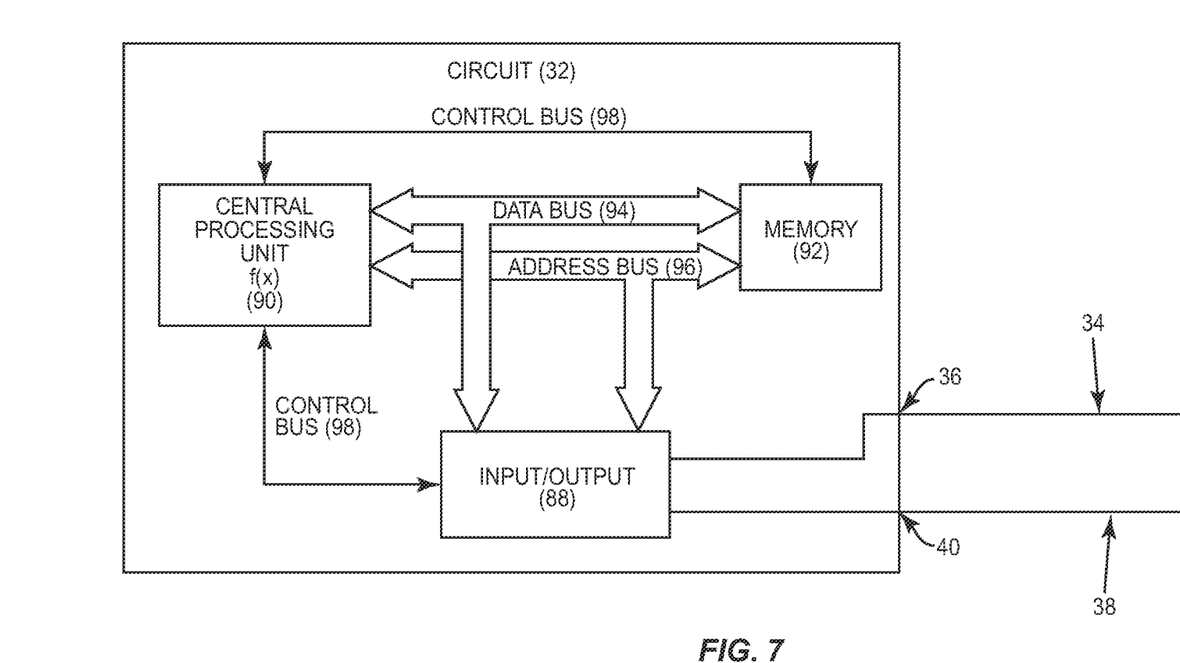
FIG. 7 illustrates a schematic diagram of an exemplary central processing unit (CPU)-based digital circuit that can be employed in the variable amplitude sinusoidal signal generator in FIGS. 3 and 6, to generate a first high-to-low PWM signal with a second low-to-high PWM signal phase offset from the first PWM signal.

In this regard, FIG. 7 illustrates a schematic diagram of an exemplary central processing unit (CPU)-based circuit 32 that can be employed in the variable amplitude sinusoidal signal generators 28, 78 in FIGS. 3 and 6, respectively, to generate a first PWM signal 34 and a second PWM signal 38 phase offset from the first PWM signal 34. The CPU-based circuit 32 employs an input/output element 88 connected to the first and second outputs 36, 40 on which the CPU-based circuit 32 outputs the first and second PWM signals 34, 38, respectively. The input/output element 88 is also connected to a CPU 90 and memory 92 by a data bus 94, an address bus 96, and a control bus 98. The CPU 90 is configured to use instructions stored in the memory 92 to control generation of the first PWM signal 34 and the second PWM signal 38 as well as the timing of the phase offset between the first PWM signal 34 and the second PWM signal 38. The CPU 90 may employ function in program code stored in memory 92 to control generation of the first PWM signal 34 and the second PWM signal 38.

Figure 8:
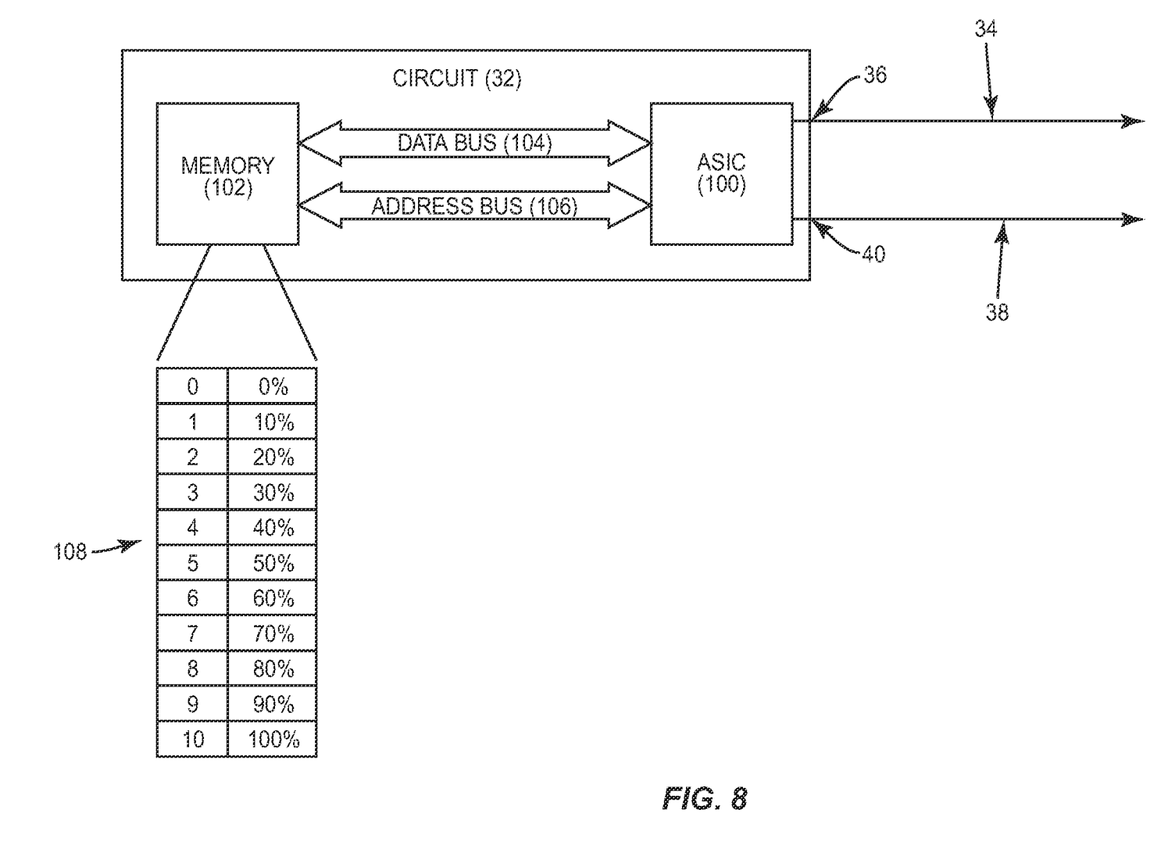
FIG. 8 illustrates a schematic diagram of an exemplary application-specific integrated circuit (ASIC)-based digital circuit that can be employed in the variable amplitude sinusoidal signal generator in FIGS. 3 and 6, to generate a first high-to-low PWM signal with a second low-to-high PWM signal phase offset from the first PWM signal.

In another embodiment, FIG. 8 illustrates a schematic diagram of an exemplary application-specific integrated circuit (ASIC)-based circuit 32 that can be employed in the variable amplitude sinusoidal signal generators 28, 78 in FIGS. 3 and 6, respectively, to generate a first PWM signal 34 and a second PWM signal 38 phase offset from the first PWM signal 34. The ASIC-based circuit 32 employs an ASIC 100 connected to the first and second outputs 36, 40 on which the ASIC-based circuit 32 outputs the first and second PWM signals 34, 38, respectively. The ASIC 100 is also connected to memory 102 by a data bus 104 and an address bus 106. The ASIC 100 generates the first PWM signal 34 having a first duty cycle based on a first duty cycle sequence stored in a look-up table 108 stored in memory 102. Memory 102 may be separate from the ASIC 100 or integrated into the ASIC 100. The ASIC 100 also generates the second PWM signal 38 having a second duty cycle based on a second duty cycle sequence stored in the look-up table 108 stored in memory 102. The ASIC 100 can also control the timing of the phase offset between the first PWM signal 34 and the second PWM signal 38. Alternatively, a programmable logic device (PLD) or field programmable gate array (FPGA) could be employed as circuit 32, if desired. The memory 102 may also be provided as part of the PLD or FPGA in this example.

It should be noted that although the CPU-based circuit 32 as shown in FIG. 7 uses a function to generate the first and second PWM signals 34, 38 and the ASIC-based circuit 32 as shown in FIG. 8 uses a look-up table, these are only two exemplary embodiments for the circuit 32 and other embodiments are possible. For example, the CPU-based circuit 32 could use a look-up table or the ASIC-based circuit 32 could implement a function in hardware.

As discussed above, the circuit 32 of sinusoidal signal generators 28, 78 in FIGS. 3 and 6, respectively, as well as the CPU 90, filter 52 and any other components disclosed herein, can be configured to execute instructions from an exemplary computer-readable medium (i.e., instructions in memory) to perform the operations and functions described above. The term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical and magnetic medium, and carrier wave signals.

Figure 9:
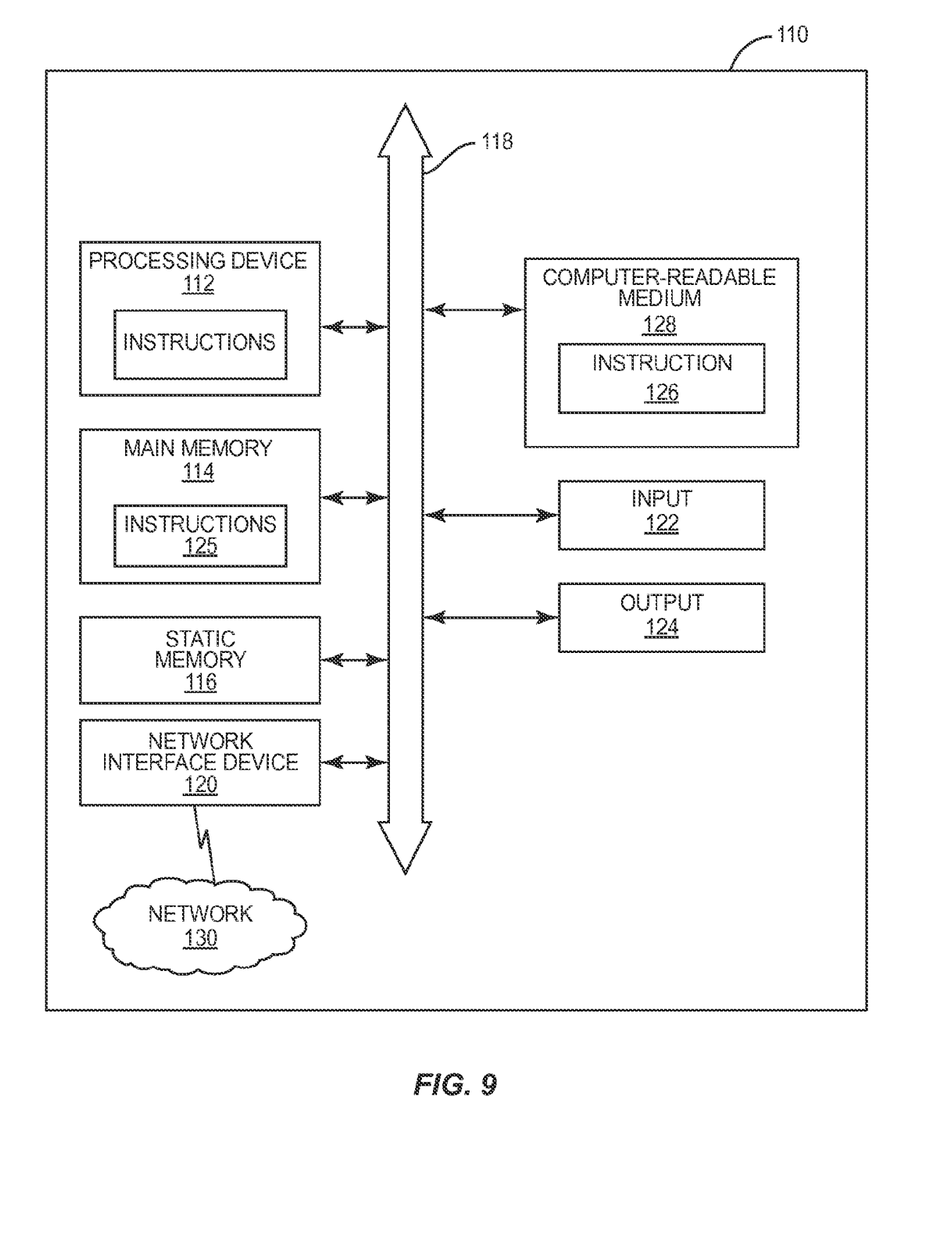
FIG. 9 is a schematic diagram of an exemplary computer system that can be included in or interface with any of the variable amplitude sinusoidal signal generators described herein.

In this regard, FIG. 9 is a schematic diagram representation of additional detail regarding an exemplary form of an exemplary computer system 110 that is configured to execute instructions from an exemplary computer-readable medium. The computer system 110 may be a controller.

In this regard, with reference to FIG. 9, the computer system 110 includes a set of instructions to perform the operations and functions described above. While only a single device is illustrated, the term "device" shall also be taken to include any collection of devices that individually or jointly execute a set (or multiple sets) of instructions to perform any one or more of the methodologies discussed herein. The exemplary computer system 110 in this embodiment includes a processing device or processor 112, a main memory 114 (e.g., read-only memory (ROM), flash memory, dynamic random access memory (DRAM) such as synchronous DRAM (SDRAM), etc.), and a static memory 116 (e.g., flash memory, static random access memory (SRAM), etc.), which may communicate with each other via the data bus 118. Alternatively, the processing device 112 may be connected to the main memory 114 and/or static memory 116 directly or via some other connectivity means. The processing device 112 may be a controller, and the main memory 114 or static memory 116 may be any type of memory.

The processing device 112 represents one or more general-purpose processing devices such as a microprocessor, central processing unit, or the like. More particularly, the processing device 112 may be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 112 is configured to execute processing logic in instructions 125 for performing the operations and steps discussed herein.

The computer system 110 may further include a network interface device 120. The computer system 110 also may or may not include an input 122 to receive input and selections to be communicated to the computer system 110 when executing instructions. The computer system 110 also may or may not include an output 124, including but not limited to a display, a video display unit (e.g., a liquid crystal display (LCD) or a cathode ray tube (CRT)), an alphanumeric input device (e.g., a keyboard), and/or a cursor control device (e.g., a mouse).

The computer system 110 may or may not include a data storage device that includes instructions 126 stored in a computer-readable medium 128. The instructions 125 may also reside, completely or at least partially, within the main memory 114 and/or within the processing device 112 during execution thereof by the computer system 110, the main memory 114 and the processing device 112 also constituting computer-readable medium. The instructions 126 may further be transmitted or received over a network 130 via the network interface device 120.

While the computer-readable medium 128 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical and magnetic medium, and carrier wave signals.

The embodiments disclosed herein include various steps. The steps of the embodiments disclosed herein may be performed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes a machine-readable storage medium (e.g., read only memory ("ROM"), random access memory ("RAM"), magnetic disk storage medium, optical storage medium, flash memory devices, etc.).

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A controller may be a processor. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

I claim:

1. A variable amplitude signal generator for generating a sinusoidal signal having limited DC offset variation, comprising:
    a circuit configured to:
        generate a first PWM signal, wherein the first PWM signal is a high-to-low PWM signal;
        generate a second PWM signal, wherein the second PWM signal is a low-to-high PWM signal out of phase with the first PWM signal;
    a combiner node configured to receive the first PWM signal and the second PWM signal, and combine the first PWM signal and the second PWM signal into a summed signal; and
    a filter configured to receive the summed signal, and filter the received summed signal into a sinusoidal signal having limited DC offset variation,
    wherein the circuit is configured to generate the second PWM signal a half cycle out of phase with the first PWM signal.

2. A variable amplitude signal generator for generating a sinusoidal signal having limited DC offset variation, comprising:

a circuit configured to:
  generate a first PWM signal, wherein the first PWM signal is a high-to-low PWM signal;
  generate a second PWM signal, wherein the second PWM signal is a low-to-high PWM signal out of phase with the first PWM signal;
a combiner node configured to receive the first PWM signal and the second PWM signal, and combine the first PWM signal and the second PWM signal into a summed signal; and
a filter configured to receive the summed signal, and filter the received summed signal into a sinusoidal signal having limited DC offset variation,
wherein the circuit is further configured to generate the first PWM signal having a first duty cycle, and further configured to generate the second PWM signal having a second duty cycle equal or substantially equal to the first duty cycle, and
wherein the circuit is further configured to vary the first duty cycle of the first PWM signal from a lower percentage to a higher percentage, and further configured to vary the second duty cycle of the second PWM signal from the lower percentage to the higher percentage.

3. The signal generator of claim 2, wherein the circuit is further configured to vary the first duty cycle of the first PWM signal up to 50%, and further configured to vary the second duty cycle of the second PWM signal up to 50%.

4. The signal generator of claim 2, wherein the circuit is further configured to vary the first duty cycle of the first PWM signal up to 100%, and further configured to vary the second duty cycle of the second PWM signal up to 100%.

5. A variable amplitude signal generator for generating a sinusoidal signal having limited DC offset variation, comprising:
  a circuit configured to:
    generate a first PWM signal, wherein the first PWM signal is a high-to-low PWM signal;
    generate a second PWM signal, wherein the second PWM signal is a low-to-high PWM signal out of phase with the first PWM signal;
  a combiner node configured to receive the first PWM signal and the second PWM signal, and combine the first PWM signal and the second PWM signal into a summed signal;
  a filter configured to receive the summed signal, and filter the received summed signal into a sinusoidal signal having limited DC offset variation;
  a first resistor configured to receive the first PWM signal from the circuit; and
  a second resistor configured to receive the second PWM signal from the circuit;
  wherein the combiner node is configured to receive the first PWM signal from the first resistor and the second PWM signal from the second resistor, and combine the first PWM signal and the second PWM signal into a summed signal.

6. A variable amplitude signal generator for generating a sinusoidal signal having limited DC offset variation, comprising:
  a circuit configured to:
    generate a first PWM signal, wherein the first PWM signal is a high-to-low PWM signal;
    generate a second PWM signal, wherein the second PWM signal is a low-to-high PWM signal out of phase with the first PWM signal;
  a combiner node configured to receive the first PWM signal and the second PWM signal, and combine the first PWM signal and the second PWM signal into a summed signal; and
  a filter configured to receive the summed signal, and filter the received summed signal into a sinusoidal signal having limited DC offset variation,
  wherein the circuit is further configured to generate the first PWM signal having a first duty cycle, and further configured to generate the second PWM signal having a second duty cycle equal or substantially equal to the first duty cycle, and
  wherein the circuit is configured to generate the first PWM signal having the first duty cycle based on a first duty cycle sequence stored in a look-up table in memory, and generate the second PWM signal having the second duty cycle based on a second duty cycle sequence stored in a look-up table in memory.

7. A method of generating a sinusoidal signal having limited DC offset variation, comprising:
  generating a first PWM signal, wherein the first PWM signal is a high-to-low PWM signal;
  generating a second PWM signal, wherein the second PWM signal is a low-to-high PWM signal out of phase with the first PWM signal;
  combining the first PWM signal and the second PWM signal into a summed signal; and
  filtering the summed signal into a sinusoidal signal having limited DC offset variation,
  wherein generating the second PWM signal further comprises generating the second PWM signal, wherein the second PWM signal is out of phase with the first PWM signal by a half cycle.

8. A method of generating a sinusoidal signal having limited DC offset variation, comprising:
  generating a first PWM signal, wherein the first PWM signal is a high-to-low PWM signal;
  generating a second PWM signal, wherein the second PWM signal is a low-to-high PWM signal out of phase with the first PWM signal;
  combining the first PWM signal and the second PWM signal into a summed signal; and
  filtering the summed signal into a sinusoidal signal having limited DC offset variation,
  wherein the generating the first PWM signal further comprises generating the first PWM signal having a first duty cycle, and generating the second PWM signal further comprises generating the second PWM signal having a second duty cycle equal or substantially equal to the first duty cycle, and
  wherein generating the first PWM signal further comprises varying the first duty cycle of the first PWM signal from a lower percentage to a higher percentage, and generating the second PWM signal further comprises varying the second duty cycle of the second PWM signal from the lower percentage to the higher percentage.

9. The method of claim 8, wherein generating the first PWM signal further comprises varying the first duty cycle of the first PWM signal up to 50%, and generating the second PWM signal further comprises varying the second duty cycle of the second PWM signal up to 50%.

10. The method of claim 8, wherein generating the first PWM signal further comprises varying the first duty cycle of the first PWM signal up to 100%, and generating the second PWM signal further comprises varying the second duty cycle of the second PWM signal up to 100%.

11. A method of generating a sinusoidal signal having limited DC offset variation, comprising:
- generating a first PWM signal, wherein the first PWM signal is a high-to-low PWM signal;
- generating a second PWM signal, wherein the second PWM signal is a low-to-high PWM signal out of phase with the first PWM signal;
- combining the first PWM signal and the second PWM signal into a summed signal; and
- filtering the summed signal into a sinusoidal signal having limited DC offset variation,
- wherein generating the first PWM signal further comprises retrieving the first PWM signal from a memory and generating the second PWM signal further comprises retrieving the second PWM signal from the memory.

* * * * *